United States Patent [19]
Chen et al.

[11] Patent Number: 4,750,025
[45] Date of Patent: Jun. 7, 1988

[54] DEPLETION STOP TRANSISTOR

[75] Inventors: Chung Y. Chen, Scotch Plains; Alfred Y. Cho, Summit, both of N.J.

[73] Assignee: American Telephone and Telegraph Company, AT&T Bell Laboratories, Murray Hill, N.J.

[21] Appl. No.: 823,985

[22] Filed: Jan. 30, 1986

Related U.S. Application Data

[63] Continuation of Ser. No. 327,501, Dec. 4, 1981, abandoned.

[51] Int. Cl.$^4$ .................. H01L 29/205; H01L 29/70
[52] U.S. Cl. ........................................ 357/34; 357/16; 357/30; 357/89
[58] Field of Search .................... 357/89, 34, 16, 30 P

[56]  References Cited

U.S. PATENT DOCUMENTS

| | | | |
|---|---|---|---|
| 2,895,058 | 7/1959 | Pankove | 357/89 |
| 3,231,796 | 1/1966 | Shombert | 357/89 |
| 3,780,359 | 12/1973 | Dumke et al. | 357/16 |
| 3,855,611 | 12/1974 | Neilson et al. | 357/89 |
| 3,915,765 | 10/1975 | Cho et al. | 357/16 |
| 4,000,506 | 12/1976 | Hirai et al. | 357/16 |
| 4,062,032 | 12/1977 | Neilson | 357/58 |
| 4,086,610 | 4/1978 | Clark et al. | 357/34 |
| 4,136,353 | 1/1979 | Polinsky | 367/34 |
| 4,151,540 | 4/1979 | Sander et al. | 357/34 |
| 4,160,258 | 7/1979 | Dawson et al. | 357/16 |
| 4,173,763 | 11/1979 | Chang et al. | 357/34 |
| 4,302,763 | 11/1981 | Ohuchi et al. | 357/34 |
| 4,380,774 | 4/1983 | Yoder | 357/34 |

FOREIGN PATENT DOCUMENTS

| | | | |
|---|---|---|---|
| 2733146 | 1/1979 | Fed. Rep. of Germany | 357/34 |
| 1232137 | 10/1960 | France | 357/34 |

OTHER PUBLICATIONS

"High Gain Wide Gap Emitter $Ga_{1-x}Al_xAs$—GaAs Phototransistor" Beneking et al., *Electronics Letters*, Aug. 5, 1976, vol. 12, No. 16, pp. 395-396.

H. C. Poon et al., "High Injection in Epitaxial Transistors," *IEEE Transactions on Electron Devices*, vol. ED-16, No. 5, May 1969, pp. 455-457.

Primary Examiner—Andrew J. James
Assistant Examiner—Jerome Jackson
Attorney, Agent, or Firm—Richard D. Laumann

[57] ABSTRACT

We have found that transistors have desirable device characteristics when the base region is composed of a lightly doped layer near the emitter junction and a heavily doped layer near the collector junction. The edge of the depletion region at the emitter-base junction is designed to stop in the lightly doped base region.

10 Claims, 2 Drawing Sheets

DEPLETION STOP TRANSISTOR

This application is a continuation of application Ser. No. 327,501 filed Dec. 4, 1981, now abandoned.

TECHNICAL FIELD

This invention relates generally to bipolar transistors and particularly to bipolar transistors having a double base or emitter region.

BACKGROUND OF THE INVENTION

The bipolar transistor, for which John Bardeen, Walter Brattain and William Shockley received the Nobel Prize in Physics, is, as is commonly known, an extremely important semiconductor device. Since its invention, the bipolar transistor has been developed to the point where it is widely used in many diverse applications such as computers for both logic and memory functions, and in virtually all modern communications systems.

One of the parameters of interest in characterizing bipolar transistors is the injection efficiency which is the fraction of the total emitter current that is injected into the base. This parameter is of interest because as it increases the common emitter or common base current gain also increases.

It is well known in the art that high injection efficiencies in bipolar transistors can be achieved by using very low doping concentrations in the base region. While a low base doping concentration does increase the injection efficiency, it unfortunately has deleterious side effects. For example, it increases both the base contact and series resistance and also aggravates the base width modulation effect.

An additional parameter of interest is the emitter junction capacitance. This parameter is of interest because it limits the transistor frequency, i.e., the cutoff frequency decreases as the capacitance increases. The capacitance decreases as the doping concentration decreases but the doping concentration can not be made too low or the emitter injection efficiency will be degraded.

SUMMARY OF THE INVENTION

We have found that a transistor having emitter, base and collector regions has desirable characteristics when at least one of these regions comprises a lightly doped region and an adjacent highly doped region. This is what is meant by double base or emitter region. In these transistors, the edges of the depletion regions are made to intentionally stop in a semiconductor layer of a particular doping level. In particular, the depletion layer at the emitter-base junction stops in the lightly doped base region and stops in the heavily doped emitter region.

In one embodiment, we have found that a high injection efficiency in bipolar transistors may be achieved with a depletion stop double base region. Such a base region has a lightly doped region adjacent to the emitter region for high injection efficiency and a heavily doped region adjacent to the collector region for reducing the base resistance and the Early effect. The structure is an embodiment of a device which uses what we term depletion stop. The depletion stop transistor may be used as a phototransistor if constructed so that the light is incident on a relatively wide bandgap region. In yet another embodiment, the transistor has a double emitter region with the lightly doped region adjacent the base region. The lightly doped emitter region is completely depleted at thermal equilibrium.

DETAILED DESCRIPTION

Figure 1:
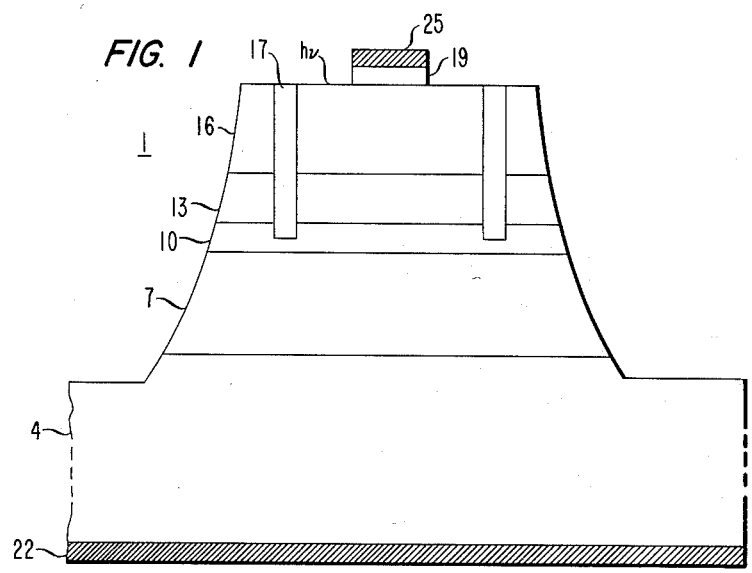
FIG. 1 is a sectional view of a device according to this invention.

A cross sectional view of a device of this invention is shown in FIG. 1. For reasons of clarity, the elements of this device are not drawn to scale. The device comprises substrate 4, collector region 7, a base region comprising regions 10 and 13, and emitter region 16. The emitter and collector regions have a first conductivity type and the base regions have a second conductivity type. Region 13 has a relatively low doping concentration while that of region 10 is relatively high. Relatively low typically means a concentration less than $10^{16}/cm^3$ and relatively high means a concentration greater than $10^{17}/cm^3$. Intermediate values may also be used provided that there is at least approximately an order of magnitude difference in the doping concentrations. The doping concentrations and layer thicknesses are related so that the depletion layer at the emitter-base junction stops in the lightly doped base region. The device further comprises an ohmic contact 22 made to substrate 4, and an ohmic contact to layer 16. This ohmic contact comprises layer 19 and layer 25. There is also an annular region 17 which has the second conductivity type and provides an electrical contact to the base region.

In one particular embodiment, suitable for use as a phototransistor, the substrate 4 is (100) oriented GaAs. The first conductivity type is n-type and the second conductivity type is p-type. The collector layer 7 is n-type GaAs, which is 2.2 $\mu$m thick and has a doping concentration of $10^{16}cm^{-1}$. A base region comprising a highly doped p-type layer 10 and a lightly doped p-type layer 13. Layer 10 comprises GaAs and is approximately 500 Angstroms thick and has a doping concentration of $5 \times 10^{17}cm^{-3}$ and layer 13 is GaAs which is 0.55 $\mu$m thick and has a doping concentration of $10^{16}cm^{-3}$. The emitter layer 16 is n-type $Al_{0.35}Ga_{0.65}As$ which is 1 $\mu$m thick and has a doping concentration of $10^{17}cm^{-3}$. Layer 19 is highly doped GaAs which facilitates formation of an ohmic contact. Layers 22 and 25 are tin-gold. This embodiment is suitable for use as a phototransistor as the wide bandgap emitter layer provides a transparent window for the incident radiation which is indicated by the arrow as h$\nu$. The mesa structure depicted has an area of approximately $1.3 \times 10^{-4}cm^2$.

The device is conveniently fabricated by conventional and well-known molecular beam epitaxy and etching techniques. Molecular beam epitaxy is a preferred technique as it enables the regions to be fabricated with essentially uniform doping concentrations within each region and with abrupt changes in doping concentration at the junction between two regions. Region 17 is conveniently fabricated by conventional lithographic and diffusion techniques. For example, a layer of photoresist is deposited on the top of layer 16, and pattern delineated to expose the desired portions of layer 16. An apropriate dopant is now added by, for example, diffusion to form region 17.

The doping concentrations and layer thicknesses are exemplary only and may be varied. However, the doping levels and layer thicknesses of the emitter and base regions are chosen, for a double base region, so that the depletion region at the emitter-base junction stops in the lightly doped base region to insure a high emitter injection efficiency. For a double emitter region, the depletion region stops in the heavily doped emitter region and the lightly doped emitter region is adjacent to the base region.

Figure 2:
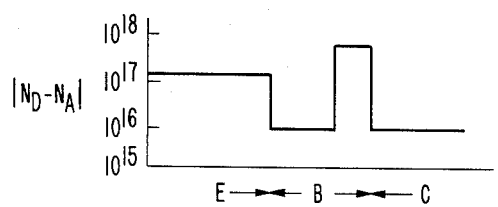
FIG. 2 shows the doping profile of a device according to this invention.

A doping profile which will produce the desired depletion layers is shown in FIG. 2. The absolute value of the difference between the number of donors and the number of acceptors is plotted on the vertical axis for the emitter, base and collector regions which are indicated by E, B and C, respectively. As can be seen, the base region comprises two regions, one of which has a doping concentration less than that of the emitter and the other of which has a doping concentration greater than that of the emitter.

Figure 3:
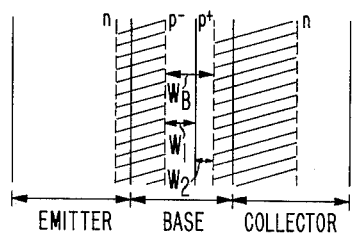
FIG. 3 shows the depletion regions of a depletion stop transistor having a double base.

The depletion layers, indicated by the hatched areas, in the emitter, base and collector regions are shown in FIG. 3 for an n-p-n transistor according to this invention. That is, the first conductivity type is n-type and the second conductivity type is p-type. $W_B$ is the width of the base region and $W_1$ and $W_2$ are the widths of the quasi-neutral base on the emitter and collector sides, respectively, of the junction between the lightly doped and highly doped base regions. As can be seen, the depletion region at the emitter-base junction stops in the lightly doped base region.

Figure 4:
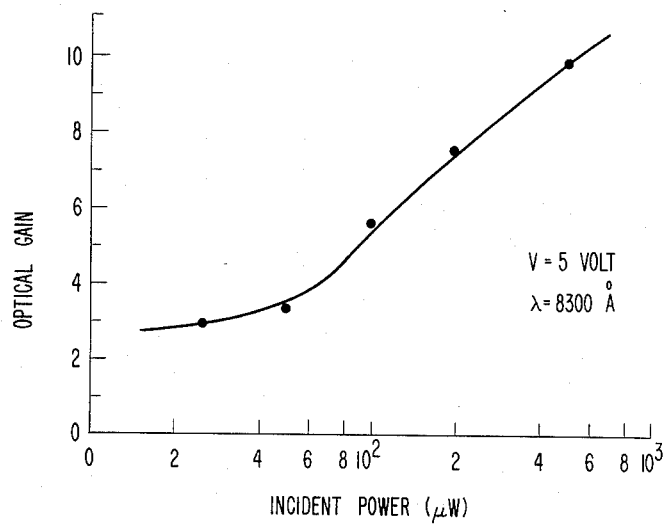
FIG. 4 plots the optical gain, vertically, versus, the incident power, horizontally, for a phototransistor according to this invention.

The device was operated as a phototransistor using a GaAs/AlGaAs injection laser emitting at a wavelength of 0.83 μm as the light source for sensitivity measurements and incident on the device as shown by the arrow in FIG. 1. No electrical connection was made to the base region. The dependence of the DC optical gain on the incident power, is depicted in FIG. 4. There was a 5 volt bias between the emitter and collector and no contact was made to the base. The incident power is plotted horizontally in units of μW and the optical gain is plotted vertically. The optical gain G is related to the sensitivity, S, by the relationship G=S (hν/q) where hν is the energy of the incident photon and q is the electron charge. The DC optical gain should increase with increasing incident power as it does with a conventional bipolar phototransistor. That this is the case can be seen from FIG. 4, where an optical gain of approximately 10 is obtained at an incident power level of approximately 500 μW. Lesser gains are obtained at lower incident power levels. The optical gain of 10 corresponds to a DC current gain, β, of approximately 20 assuming that the internal quantum efficiency is approximately 50 percent.

The response speed of the device was tested using a 4 psec dye laser emitting at a wavelength of approximately 6100 Angstroms. The rise time was approximately 35 psec and was limited by the RC time constant. The fall time was approximately 2 nsec which represents the recombination lifetime of the minority electrons in the quasi-neutral base region.

Figure 5:
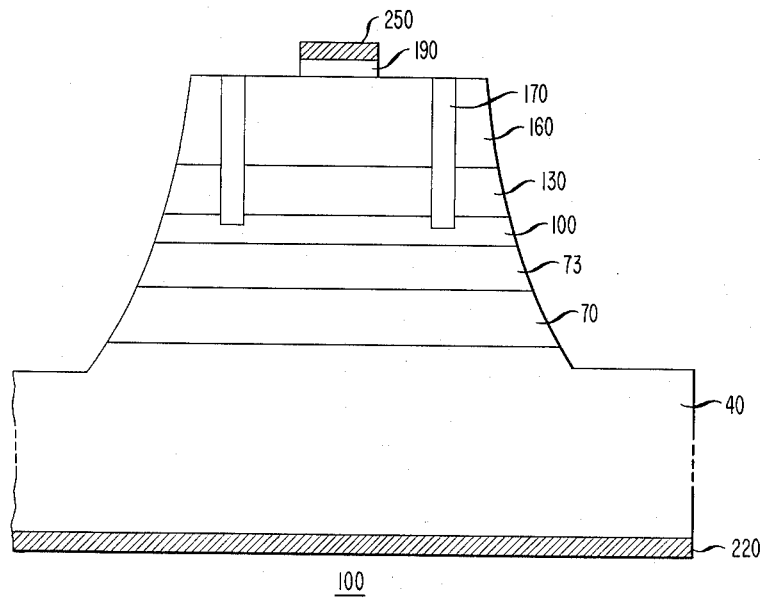
FIG. 5 is a sectional view of another device according to this invention.

Other embodiments are contemplated. For example, FIG. 5 shows schematic diagram of a depletion stop double emitter double base transistor. The device comprises substrate 40, an emitter region comprising regions 160 and 130, a base region comprising regions 100 and 73, and collector region 70. The emitter and collector regions have a first conductivity type and the base regions have a second conductivity type. Region 160 has a relatively high doping concentration while that of region 130 is relatively low. Region 100 has a relatively low doping concentration while that of region 73 is relatively high. The doping concentrations and layer thicknesses are selected so that the depletion region at the emitter-base junction stops in the lightly doped base region and in the heavily doped emitter region. The lightly doped emitter region desirably has a doping concentration less than that of the base region as it is thus easier to have the edge of the depletion layer in the heavily doped emitter region. The device further comprises an ohmic contact 220 made to substrate 40, and ohmic contact layers 250 and 190 to emitter region 160. This ohmic contact comprises layer 190 and layer 250. There is also an annular region 170 which has the second conductivity type and provides an electrical contact to the base region. In addition to the double base which has been discussed, the double emitter double base transistor further comprises a lightly doped emitter layer close to the emitter-base junction an a heavily doped emitter layer close to the electrical contact to the emitter. The lightly doped emitter layer is made fully depleted at any bias condition. This structure reduces the emitter capacitance significantly without sacrificing the emitter injection efficiency. A direct consequence of this is a high transition frequency, $f_T$, in a bipolar transistor.

Further, although the invention has been described specifically with respect to a GaAs device, it may equally well be used in silicon based devices. Furthermore, the device depicted in FIGS. 1 and 5 may be operated, as described, without an electrical contact to the base region. Other modifications are contemplated. For example, the device may be fabricated with a double emitter region and a single base region. Also, although the invention has been described by reference to individual devices, it is contemplated that the invention may be practiced with a plurality of devices on a single chip.

The operation of the device may be better understood by the following theoretical considerations. The emitter injection efficiency, γ, of a bipolar transistor is given by equation 1:

$$\gamma = \frac{J_n}{J_n + J_p + J_{rd}} = \frac{1}{1 + \frac{J_p}{J_n} + \frac{J_{rd}}{J_n}} \quad (1)$$

where $J_n$ is the diffusion current of electrons injected into the base, $J_p$ is the diffusion current of holes injected into the emitter, and $J_{rd}$ is the recombination or defect current at the emitter junction. For a wide gap emitter:

$$\frac{J_p}{J_n} = \left( \frac{D_{hE} N_A W_B}{D_{eB} N_D W_E} \right) \left( \frac{m_{eE} m_{hE}}{m_{eB} m_{hB}} \right)^{3/2} \exp(-\Delta E_g / kT) \quad (2)$$

where $N_D$, $W_E$, $m_{eE}$, $m_{hE}$, and $N_A$, $W_B$, $m_{eB}$, and $m_{hB}$ respectively correspond to the doping level, width, electron effective mass and hole effective mass in the emitter and base regions. The band gap energy difference between the emitter and base is $\Delta E_g$, $D_{hE}$ is the diffusion coefficient of holes in the emitter and $D_{eB}$ is the diffusion coefficient of electrons in the base. Since $\Delta E_g$ in the described structure is approximately 0.44 eV, $J_p/J_n$ becomes negligibly small compared to unity. Therefore, $\gamma$ becomes approximately equal to:

$$\gamma = \frac{1}{1 + \frac{J_{rd} N_A W_B}{q D_{eB} n_{iB}^2} \exp(-qV/kT)} \quad (3)$$

where V is the applied emitter-base voltage and $n_{iB}$ is the intrinsic carrier concentration in the base. It is not necessary to go into the details of $J_{rd}$ to see that reducing the base doping level, $N_A$, can increase the emitter injection efficiency. Assuming $J_{rd}$ to be dominated by the space charge region recombination, we estimate that $\gamma$ equals approximately 0.993 for the depletion stop double base structure as compared to 0.9277 for a highly doped single base structure when both devices are operated under the same conditions.

An additional effect that should be considered is the $\delta$ functionlike built-in field that arises from the double base structure. This built-in field acts to retard the diffusion processes of minority electrons and may reduce the base transport factor to some extent. It may be shown that the base transport factor $\alpha_T$ may be represented by:

$$\alpha_T = 1 - \tfrac{1}{2}\left(\frac{W_1}{L_{n1}}\right)^2 - \tfrac{1}{2}\left(\frac{W_2}{L_{n2}}\right)^2 - \frac{1}{\tau_{n1} D_{n2}} \frac{P_2}{P_1} W_1 W_2 \quad (4)$$

where $P_1$, $W_1$, and $P_2$, $W_2$, are the doping levels, and the width of the quasi-neutral base in emitter and collector side, respectively. In order to minimize the effect on the base transport factor, $P_2/P_1$ should be optimized, and $W_1$ and $W_2$ should be kept small. For $L_{n1} = 5$ μm, $L_{n2} = 1$ μm, $W_1 = 0.1$ μm, and $W_2 = 0.005$ μm, $\alpha_T$ for the double base structure is approximately 0.99703. By way of comparison, a highly doped single base structure with $W_B = 0.005$ μm, $\alpha_T$ is approximately 0.99875. Combining $\alpha_T$ with $\gamma$, yields a value of $\beta$ of approximately 100 for the depletion stop double base tansistor.

We claim:

1. A transistor structure comprising an emitter region, a base region, and a collector region, said base region being intermediate said emitter region and said collector region, said emitter and collector regions having a first conductivity type and said base region having a second conductivity type, said base region having a depletion layer and further comprising a first region having a doping concentration less than $10^{16}/cm^3$ and a second region having a doping concentration greater than $10^{17}/cm^3$, said doping concentration being essentially uniform except for an abrupt change at the interface of said first and said second regions, said first region contacting a region of opposite conductivity type and the depletion layer terminating in said first region at zero bias, said first region contacting said emitter region, said second region contacting said collector region and having a doping concentration greater than that of said collector region.

2. A structure as recited in claim 1 in which said second base region has a doping concentration greater than that of said emitter region.

3. A structure as recited in claim 2 in which the conductivity type of said base region is p-type.

4. A structure as recited in claim 3 in which said regions comprise a Group III-V semiconductor compound.

5. A structure as recited in claim 4 in which said emitter region comprises AlGaAs.

6. A structure as recited in claim 5 in which said collector region comprises GaAs.

7. A structure as recited in claim 6 further comprising an electrical contact to said base region.

8. A structure as recited in claim 1, in which said emitter region comprises third and fourth regions, said third region contacting said base region and being lightly doped, said depletion layer at the emitter-base junction stopping in said fourth region.

9. A structure as recited in claim 8 in which said fourth region has a doping concentration greater than that of said third region.

10. A structure as recited in claim 9 in which said third region has a doping concentration less than that of said base region.

* * * * *